US011668749B2

(12) United States Patent
Pai

(10) Patent No.: US 11,668,749 B2
(45) Date of Patent: Jun. 6, 2023

(54) METHOD FOR ELIMINATING FAKE FAULTS IN GATE-LEVEL SIMULATION

(71) Applicant: Silicon Motion, Inc., Jhubei (TW)

(72) Inventor: Chia-Cheng Pai, Taipei (TW)

(73) Assignee: SILICON MOTION, INC., Jhubei (TW)

( * ) Notice: Subject to any disclaimer, the term of this patent is extended or adjusted under 35 U.S.C. 154(b) by 400 days.

(21) Appl. No.: 17/002,870

(22) Filed: Aug. 26, 2020

(65) Prior Publication Data

US 2022/0065931 A1     Mar. 3, 2022

(51) Int. Cl.
*G01R 27/28* (2006.01)
*G01R 31/317* (2006.01)
*G01R 31/3193* (2006.01)

(52) U.S. Cl.
CPC .  *G01R 31/31725* (2013.01); *G01R 31/31937* (2013.01)

(58) Field of Classification Search
CPC combination set(s) only.
See application file for complete search history.

(56) References Cited

U.S. PATENT DOCUMENTS

| 9,875,333 | B1 * | 1/2018 | Verma | G06F 30/3312 |
|---|---|---|---|---|
| 10,031,986 | B1 * | 7/2018 | Kumar | G06F 30/3312 |
| 10,776,547 | B1 * | 9/2020 | Gupta | G06F 16/9024 |
| 10,915,685 | B1 * | 2/2021 | Gupta | G06F 30/327 |
| 2012/0002528 | A1 | 1/2012 | Endo | |
| 2016/0070844 | A1 * | 3/2016 | Shyamsukha | G06F 30/398 |
| | | | | 716/113 |
| 2018/0314771 | A1 * | 11/2018 | Lee | G06F 30/398 |
| 2020/0026812 | A1 * | 1/2020 | Feng | G06F 30/367 |

FOREIGN PATENT DOCUMENTS

| CN | 107862161 A | 3/2018 |
|---|---|---|
| CN | 108804734 A | 11/2018 |
| CN | 109446708 A | 3/2019 |
| TW | 201214427 A1 | 4/2012 |

* cited by examiner

*Primary Examiner* — Thang X Le
(74) *Attorney, Agent, or Firm* — McClure, Qualey & Rodack, LLP

(57) ABSTRACT

A method for determining the propagation delay of each path in an integrated circuit is provided herein. The method includes determining, in a worst-based mode, whether a propagation delay of a selected path exceeds a timing requirement; determining, in a path-based mode, whether the propagation delay of a selected path exceeds the timing requirement; and when the selected path exceeds the timing requirement in the path-based mode, lowering the cell delay of each cell in the selected path.

18 Claims, 3 Drawing Sheets

METHOD FOR ELIMINATING FAKE FAULTS IN GATE-LEVEL SIMULATION

BACKGROUND OF THE INVENTION

Field of the Invention

The disclosure is related to methods for eliminating fake faults in gate-level simulations and shortening the design flow cycle.

Description of the Related Art

In the automated design of integrated circuits, static timing analysis (STA) is utilized to check the propagation delay of each path in an integrated circuit. In a conventional static timing analysis, the timing signoff is utilized to correctly determine the propagation delay of each path in an integrated circuit, and the maximal and minimal cell delays of each cell in each path (referred to as the worst-based mode in the following paragraphs) are then determined based on the results of the timing signoff for the gate-level simulation.

When it is determined that the integrated circuit does not meet the timing requirement in the gate-level simulation, it is determined whether there are any fake faults that have occurred in the integrated circuit. When it is determined that at least one fake fault has occurred in the circuit, the method calls for lowering the corresponding cell delay of a cell and the corresponding propagation delay of a path to waive the fake fault, and re-running the gate-level simulation. This operation is performed several times until the circuit meets the timing requirement.

However, the corresponding cell delay and the corresponding propagation delay are usually lowered manually and the number of iterations is unexpected, which leads to time-consuming operations and inefficiency. In order to shorten the design cycle and to efficiently determine the propagation delays in an integrated circuit, a method for speeding up the static timing analysis is required.

BRIEF SUMMARY OF THE INVENTION

A new static timing analysis is provided herein. Fake faults are eliminated prior to the gate-level simulation so that the design cycle can be shortened. A timing adjusting method is also provided herein to eliminate the fake faults. Therefore, a fake fault in the integrated circuit can be eliminated automatically to further shorten the duration of the design cycle.

In an embodiment, a method for adjusting a propagation delay of each path in an integrated circuit is provided. The method comprises determining, in a worst-based mode, whether a propagation delay of a selected path exceeds a timing requirement; determining, in a path-based mode, whether the propagation delay of a selected path exceeds the timing requirement; and when the selected path does not exceed the timing requirement in the path-based mode, lowering a cell delay in the worst-based mode of each cell in the selected path.

According to an embodiment of the invention, a cell delay of each cell in each path is obtained in a timing signoff to determine the propagation delay of each path in the integrated circuit in the path-based mode. The maximal cell delay and the minimal cell delay of each cell in each path are obtained from the timing signoff to determine the propagation delay of each path in the integrated circuit in the worst-based mode.

According to an embodiment of the invention, the step of lowering the delay in the worst-based mode of each cell in the selected path further comprises lowering a maximal cell delay in the worst-based mode of each cell in the selected path by a ratio.

According to an embodiment of the invention, the method further comprises when the propagation delay of the selected path does not exceed the timing requirement in the path-based mode, determining whether the propagation delay of another selected path from a pool exceeds the timing requirement in the path-based mode.

According to an embodiment of the invention, the method further comprises when the propagation delay of the selected path exceeds the timing requirement in the path-based mode, determining whether the propagation delay of the selected path exceeds the timing requirement by a ratio; when the propagation delay of the selected path does not exceed the timing requirement by the threshold, lowering the cell delay of each cell in the selected path, wherein information about an updated cell delay of the at least one cell in the selected path is stored in a register; and when the propagation delay of the selected path exceeds the timing requirement by the threshold, popping up a warning message and determining whether the propagation delay of another selected path from a pool exceeds the timing requirement in the path-based mode.

According to an embodiment of the invention, the method further comprises after the step of lowering the cell delay of each cell in the selected path, determining whether the propagation delay of another selected path from the pool exceeds the timing requirement in the path-based mode.

According to an embodiment of the invention, the method further comprises before the step of determining whether the propagation delay of another selected path from the pool exceeds the timing requirement in the path-based mode, determining whether the pool is empty; when the pool is empty, determining whether the register is empty; when the pool is not empty, selecting another selected path from the pool; when the pool and the register are empty, ending the method; when the pool is empty and the register is not empty, updating the propagation delay of each path in the integrated circuit in the worst-based mode according to the updated cell delay in the register; and after the step of updating the propagation delay of each path in the integrated circuit according to the updated cell delay in the register, executing the step of collecting the first predetermined number of paths violating the timing requirement into the pool once again.

According to an embodiment of the invention, the step of determining whether the pool is empty, the step of determining whether the register is empty, the step of updating the propagation delay of each path in the integrated circuit in the worst-based mode according to the updated cell delay in the register, and the step of collecting the first predetermined number of paths whose propagation delay exceeds the timing requirement into the pool are performed a second predetermined number of times.

According to an embodiment of the invention, the method further comprises when the second predetermined number is lower than the first predetermined number, the first predetermined number remains the same in the next iteration.

According to an embodiment of the invention, the method further comprises when the second predetermined number is increased by 1, the first predetermined number is increased by 1 accordingly.

In an embodiment, a non-transitory computer readable medium storing program code for determining a propagation delay of each path in an integrated circuit is provided. The program code comprises a set of instructions, stored on the computer readable medium, that when executed by a computer, causes the computer to perform the following operations. Whether a propagation delay of a selected path exceeds a timing requirement is determined in a worst-based mode. A determination is made while in the path-based mode whether the propagation delay of a selected path exceeds the timing requirement. When the selected path does not exceed the timing requirement in the path-based mode, a cell delay in the worst-based mode of each cell in the selected path is lowered.

According to an embodiment of the invention, a cell delay of each cell in each path is obtained in a timing signoff to determine the propagation delay of each path in the integrated circuit in the path-based mode. A maximal cell delay and a minimal cell delay of each cell in each path are obtained from the timing signoff to determine the propagation delay of each path in the integrated circuit in the worst-based mode.

According to an embodiment of the invention, the operation of lowering the delay in the worst-based mode of each cell in the selected path further comprises lowering a maximal cell delay in the worst-based mode of the each cell in the selected path by a ratio.

According to an embodiment of the invention, the operations further comprise when the propagation delay of the selected path does not exceed the timing requirement in the path-based mode, determining whether the propagation delay of another selected path from a pool exceeds the timing requirement in the path-based mode.

According to an embodiment of the invention, the operations further comprise when the propagation delay of the selected path exceeds the timing requirement in the path-based mode, determining whether the propagation delay of the selected path exceeds the timing requirement by a threshold; when the propagation delay of the selected path does not exceed the timing requirement by the threshold, lowering the cell delay of each cell in the selected path, wherein information about an updated cell delay of the at least one cell in the selected path is stored in a register; and when the propagation delay of the selected path exceeds the timing requirement by the threshold, popping up a warning message and determining whether the propagation delay of another selected path from a pool exceeds the timing requirement in the path-based mode.

According to an embodiment of the invention, the operations further comprise: after the step of lowering the cell delay of each cell in the selected path, determining whether the propagation delay of another selected path from the pool exceeds the timing requirement in the path-based mode.

According to an embodiment of the invention, the operations further comprise before the step of determining whether the propagation delay of another selected path from the pool exceeds the timing requirement in the path-based mode, determining whether the pool is empty; when the pool is empty, determining whether the register is empty; when the pool is not empty, selecting another selected path from the pool; when the pool and the register are empty, ending the method; when the pool is empty and the register is not empty, updating the propagation delay of each path in the integrated circuit in the worst-based mode according to the updated cell delay in the register; and after the step of updating the propagation delay of each path in the integrated circuit according to the updated cell delay in the register, executing the step of collecting the first predetermined number of paths violating the timing requirement into the pool once again.

According to an embodiment of the invention, the operation of determining whether the pool is empty, the operation of determining whether the register is empty, the operation of updating the propagation delay of each path in the integrated circuit in the worst-based mode according to the updated cell delay in the register, and the operation of collecting the first predetermined number of paths whose propagation delay exceeds the timing requirement into the pool are performed a second predetermined number of times.

According to an embodiment of the invention, when the second predetermined number is lower than the first predetermined number, the first predetermined number remains the same in the next iteration.

According to an embodiment of the invention, when the second predetermined number is increased by 1, the first predetermined number is increased by 1 accordingly.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
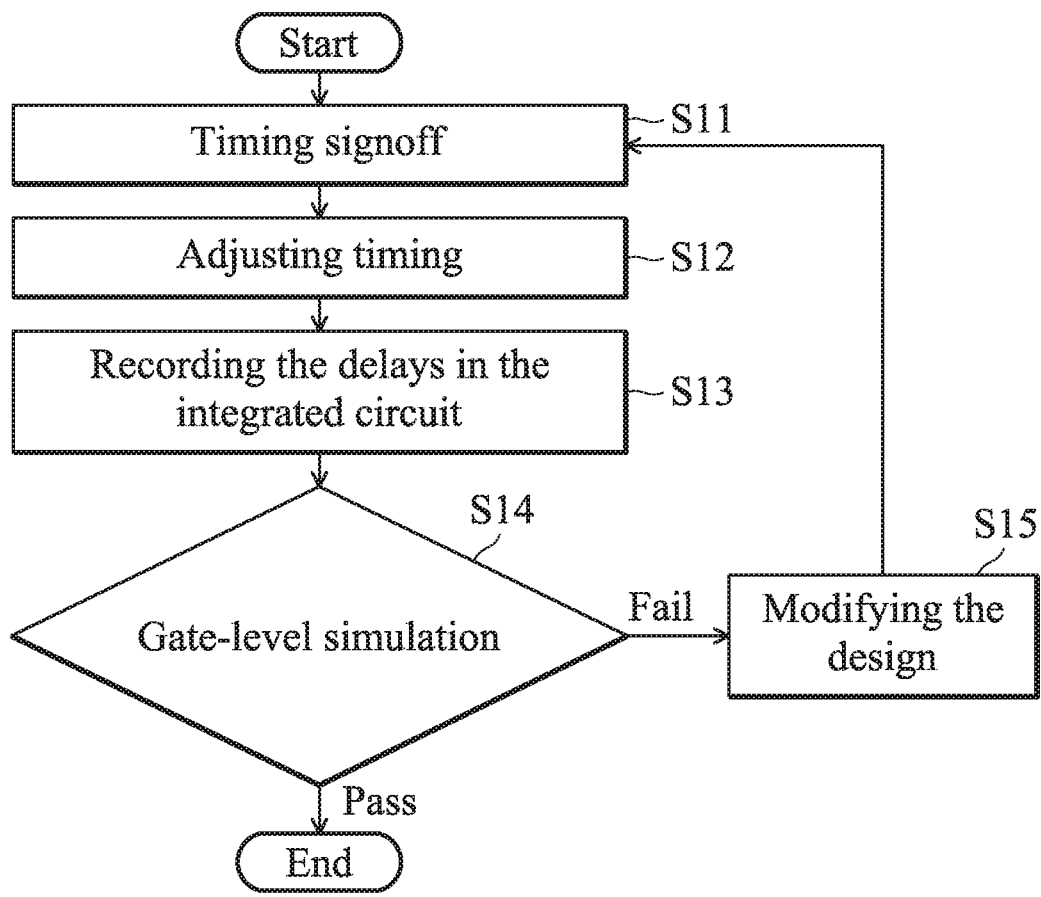
FIG. 1 is a flow chart of a static timing analysis in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It will be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a flow chart of a static timing analysis in accordance with an embodiment of the invention. As shown in FIG. 1, when the static timing analysis 100 is performed on an integrated circuit, timing signoff is first performed on the integrated circuit (Step S11).

Figure 2:
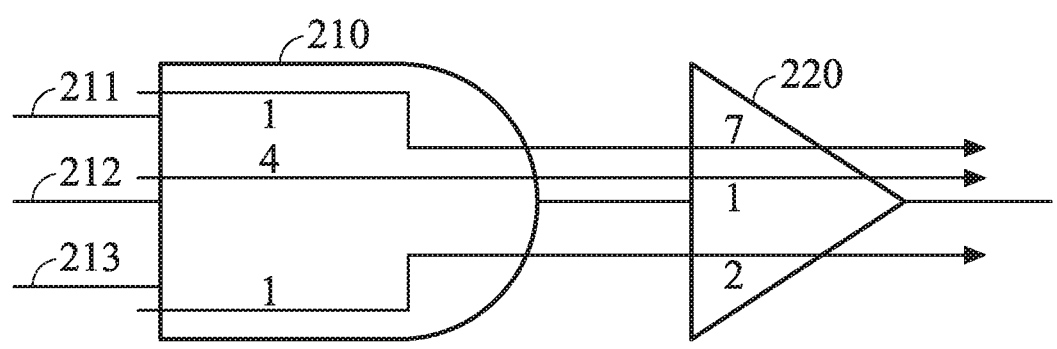
FIG. 2 illustrates delays in an integrated circuit in accordance with an embodiment of the invention.

FIG. 2 illustrates delays in an integrated circuit in accordance with an embodiment of the invention. As shown in FIG. 2, the integrated circuit 200 includes a first logic gate 210 and a second logic gate 220. The integrated circuit 200 also includes three signal paths, i.e., a first path 211, a second path 212, and a third path 213, from the input terminals of the first logic gate 210 to the output terminal of the second logic gate 220.

In Step S11, it is determined that the delay of the first path 211 is 1 added by 7, the delay of the second path 212 is 4 added by 1, and the delay of the third path 213 is 1 added by 2. In other words, the cell delays of the first logic gate 210 are 1, 4 and 1 corresponding to different paths. The cell delays of second logic gate are 7, 1 and 2. The delays in FIG. 2 is merely illustrated for explanation, but not intended to be limited thereto.

Refer to FIG. 1. After the timing signoff, the delays in the integrated circuit are adjusted (Step S12) for the gate-level simulation. According to some embodiments of the invention, the delays in the integrated circuit are adjusted for eliminating the fake fault in the gate-level simulation. Then, the delay in the worst-based mode of each cell in the integrated circuit is record for the gate-level simulation (Step S13).

The gate-level simulation is simulated based on the recorded delays in Step S13 (Step S14) to determine whether the integrated circuit passes or fails the timing requirement. When it is determined in Step S14 that the integrated circuit passes the timing requirement, the static timing analysis is complete. When it is determined in Step 14 that the integrated circuit fails the timing requirement, it indicates that the design of the integrated circuit should be fixed to meet the timing requirement. Therefore, the design is modified in Step S15, and the static timing analysis 100 goes back to Step S11.

According to some embodiments of the invention, since the delays of the integrated circuit have been adjusted prior to the gate-level simulation, no fake fault will occur in the results of the gate-level simulation. Namely, when it is determined that the integrated circuit does not meet the timing requirement in Step S14, this is an indication that the integrated circuit should be modified to meet the timing requirement. Therefore, it is unnecessary for the designer to manually waive a fake fault in the results of the gate-level simulation or to re-run the gate-level simulation, which can lead to shortening the design cycle and efficiently determining the propagation delays in the integrated circuit.

Figure 3:
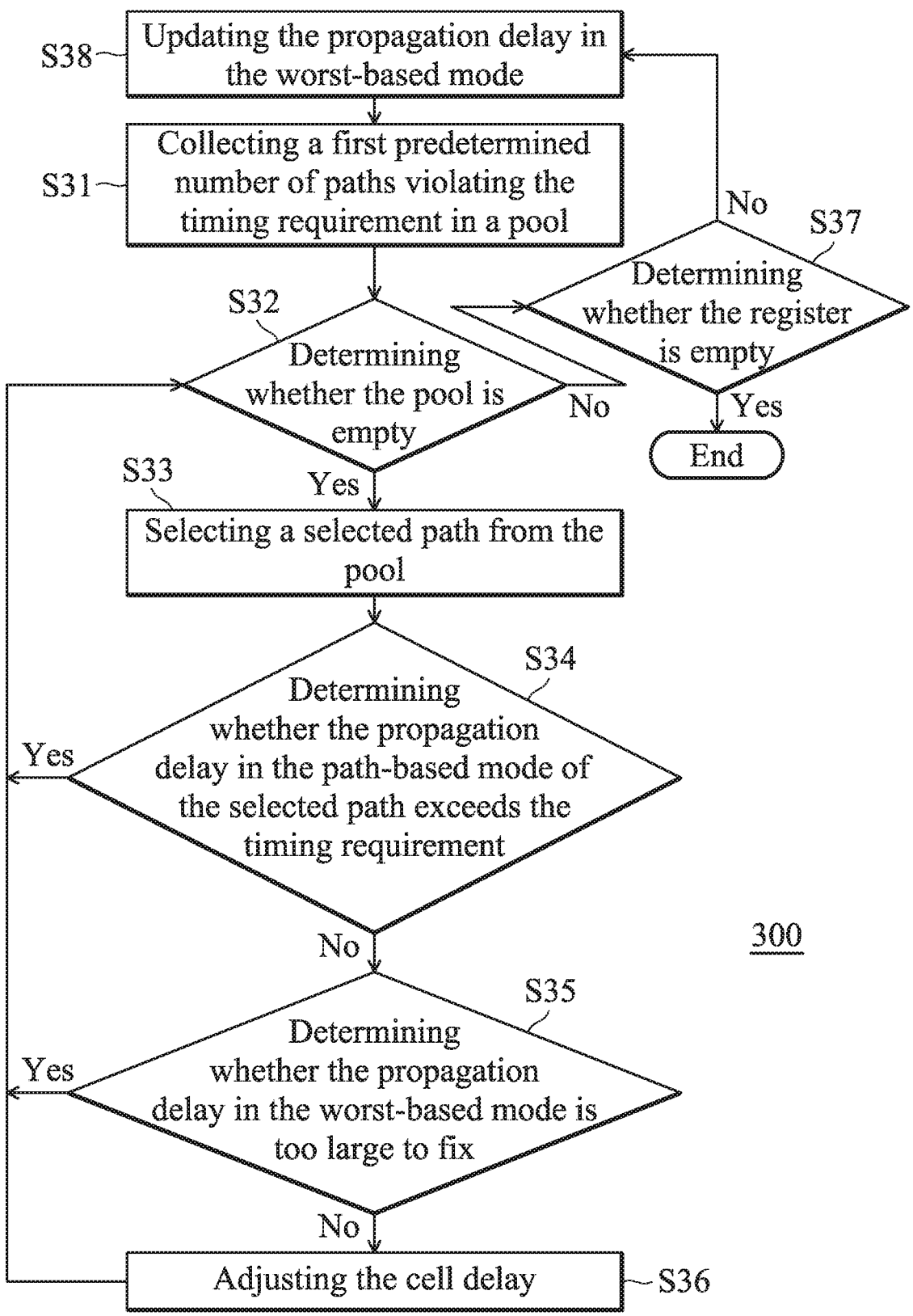
FIG. 3 is a flow chart of a method for adjusting timing of an integrated circuit in accordance with an embodiment of the invention.

FIG. 3 is a flow chart of a method for adjusting timing of an integrated circuit in accordance with an embodiment of the invention. As shown in FIG. 3, the method 300 corresponds to Step S12 in FIG. 1. In Step S31, a first predetermined number of paths in the integrated circuit with its propagation delay exceeding the timing requirement are collected in a pool, in which the propagation delay of each path is determined in the worst-based mode.

According to an embodiment of the invention, in the worst-based mode, only the maximal and minimal cell delays of each cell in each path, which are obtained from timing signoff, are utilized to determine the propagation delay of each path in the integrated circuit.

As illustrated in FIG. 2, the maximal and minimal cell delays of the second logic gate 220 are 7 and 1. Therefore, the propagation delays of the first path 211, the second path 212, and the third path 213 are (1+7=8), (4+7=11), and (1+7=8), respectively. According to an embodiment of the invention, the timing requirement is 10 such that the slack of the second path 212 is −1. This indicates that the propagation delay of the second path 212 exceeds the timing requirement. Therefore, the second path 212 is collected in the pool in Step S31.

Refer to FIG. 3. A determination is made as to whether the pool is empty (Step S32). When the pool is not empty, a selected path is selected from the pool (Step S33) to determine whether the propagation delay in the path-based mode of the selected path exceeds the timing requirement (Step S34).

As illustrated in FIG. 2, since the slack of the second path 212 is determined to be −1, the second path 212 is further determined whether its propagation delay in the path-based mode exceeds the timing requirement. As shown in FIG. 2, the propagation delay in the path-based mode of the second path 212 is (4+1=5) such that the slack of the second path 212 is actually 5, instead of −1.

According to an embodiment of the invention, when it is determined that the propagation delay in the path-based mode of the selected path exceeds the timing requirement in Step S34, the selected path is record in a library and the method 300 goes back to Step S32 to select another path from the pool. According to an embodiment of the invention, since the delay of the selected path exceeds the timing requirement, the violation should be waived by design modification. According to another embodiment of the invention, when it is determined that the propagation delay in the path-based mode of the selected path does not exceed the timing requirement in Step S34, the method 300 goes to Step S35 to further determine whether the propagation delay in the worst-based mode of the selected path exceeds the timing requirement by a threshold.

According to an embodiment of the invention, when it is determined in Step S35 that the propagation delay in the worst-based mode of the second path 212 in FIG. 2 exceeds the timing requirement (for example, 10) by the threshold (for example, 5), it indicates that the violation of the second path 212 is too large to fix. A warning message would be popped up in the screen and the method 300 goes back to Step S32 for selecting another path in the pool.

According to another embodiment of the invention, when it is determined in Step S35 that the propagation delay in the worst-based mode of the second path 212 in FIG. 2 does not exceed the timing requirement (for example, 10) by the threshold, the maximal cell delay in the worst-based mode of each cell in the second path 212 in FIG. 2 is lowered (Step S36) and the information about the updated cell delays is stored in a register.

According to an embodiment of the invention, the cell delay in the worst-based mode of at least one cell in the selected path is lowered by lowering the maximal cell delay of each cell in the selected path by a ratio, in which the ratio can be chosen by the designer.

After Step S36, the method 300 goes to Step S32. When it is determined in Step S32 that the pool is empty, it is determined whether the register is empty (Step S37), which stores the information about the updated cell delay. According to an embodiment of the invention, when the register is empty, the method 300 ends, and Step S13 in FIG. 1 is executed.

According to another embodiment of the invention, when the register is not empty, the propagation delay in the worst-based mode of each path in the integrated circuit is updated according to the updated cell delay stored in the register (Step S38). After updating the propagation delay of each path in the integrated circuit, the method 300 goes back to the Step S31 to collect the first predetermined number of paths with its propagation delay in the worst-based mode exceeding the timing requirement in the pool.

According to some embodiments of the invention, Step S31, Step S32, Step S37 and Step S38 are performed a second predetermined number of times to adjusting the timing of the integrated circuit. Since the more (i.e., the first predetermined number) paths is collected in the pool, the more times (i.e., the second predetermined number) Step S31, Step S32, Step S37 and Step S38 should be performed to end the method 300.

According to an embodiment of the invention, when the second predetermined number is increased by 1, the first predetermined number is increased by 1 accordingly, and the initial value of the first predetermined number is 1. According to an embodiment of the invention, when the second predetermined number is lower than the first predetermined number, the first predetermined number remains the same in the next iteration.

Namely, the first predetermined number should be small in the beginning to adjust a few of the paths in the integrated circuit to meet the timing requirement, so that there could be fewer iterations of Step S31, Step S32, Step S37 and Step S38. After some paths in the integrated circuit have been adjusted and there are still lots of paths waiting for adjustment, the first predetermined number is increased gradually. For example, the first predetermined number may be 1, 2, 3, etc.

When the method 300 ends, Step S13 in FIG. 1 is then executed to record the cell delay in worst-based mode of each cell in the integrated circuit. Since all the fake faults were eliminated in Step S12 (i.e., the method 300), there would not be a fake fault occurred in the result of the gate-level simulation. In other words, when it is determined that the propagation delay of the integrated circuit exceeds the timing requirement in Step S14, the design should be modified since the fake fault has been eliminated in Step S12.

A static timing analysis is provided herein to eliminate the fake fault prior to the gate-level simulation such that the design cycle can be shortened. A timing adjusting method is also provided herein to eliminate the fake fault. Therefore, the fake fault of the integrated circuit can be eliminated automatically to further shorten the duration of the design cycle.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for adjusting propagation delay of each path in an integrated circuit, comprising:
   determining, in a worst-based mode, whether a propagation delay of a selected path exceeds a timing requirement;
   determining, in a path-based mode, whether the propagation delay of the selected path exceeds the timing requirement; and
   when the selected path does not exceed the timing requirement in the path-based mode, lowering a cell delay in the worst-based mode of each cell in the selected path, wherein the step of lowering the delay in the worst-based mode of each cell in the selected path further comprises:
   lowering a maximal cell delay in the worst-based mode of each cell in the selected path.

2. The method as defined in claim 1, wherein a cell delay of each cell in each path is obtained in a timing signoff to determine the propagation delay of each path in the integrated circuit in the path-based mode, wherein a maximal cell delay and a minimal cell delay of each cell in each path are obtained from the timing signoff to determine the propagation delay of each path in the integrated circuit in the worst-based mode.

3. The method as defined in claim 1, further comprising:
   when the propagation delay of the selected path does not exceed the timing requirement in the path-based mode, determining whether the propagation delay of another selected path from a pool exceeds the timing requirement in the path-based mode.

4. The method as defined in claim 1, further comprising:
   when the propagation delay of the selected path exceeds the timing requirement in the path-based mode, determining whether the propagation delay of the selected path exceeds the timing requirement by a threshold;
   when the propagation delay of the selected path does not exceed the timing requirement by the threshold, lowering the cell delay of each cell in the selected path, wherein information about an updated cell delay of the at least one cell in the selected path is stored in a register; and
   when the propagation delay of the selected path exceeds the timing requirement by the threshold, popping up a warning message and determining whether the propagation delay of another selected path from a pool exceeds the timing requirement in the path-based mode.

5. The method as defined in claim 4, further comprising:
after the step of lowering the cell delay of each cell in the selected path, determining whether the propagation delay of another selected path from the pool exceeds the timing requirement in the path-based mode.

6. The method as defined in claim 4, further comprising:
before the step of determining whether the propagation delay of another selected path from the pool exceeds the timing requirement in the path-based mode, determining whether the pool is empty;
when the pool is empty, determining whether the register is empty;
when the pool is not empty, selecting another selected path from the pool;
when the pool and the register are empty, ending the method;
when the pool is empty and the register is not empty, updating the propagation delay of each path in the integrated circuit in the worst-based mode according to the updated cell delay in the register; and
after the step of updating the propagation delay of each path in the integrated circuit according to the updated cell delay in the register, executing the step of collecting the first predetermined number of paths violating the timing requirement into the pool once again.

7. The method as defined in claim 6, wherein the step of determining whether the pool is empty, the step of determining whether the register is empty, the step of updating the propagation delay of each path in the integrated circuit in the worst-based mode according to the updated cell delay in the register, and the step of collecting the first predetermined number of paths whose propagation delay exceeds the timing requirement into the pool are performed a second predetermined number of times.

8. The method as defined in claim 7, wherein when the second predetermined number is lower than the first predetermined number, the first predetermined number remains the same in the next iteration.

9. The method as defined in claim 7, wherein when the second predetermined number is increased by 1, the first predetermined number is increased by 1 accordingly.

10. A non-transitory computer readable medium storing program code for determining a propagation delay of each path in an integrated circuit, the program code comprising a set of instructions, stored on the computer readable medium, that when executed by a computer, causes the computer to perform the following operations:
determining, in a worst-based mode, whether a propagation delay of a selected path exceeds a timing requirement;
determining, in a path-based mode, whether the propagation delay of a selected path exceeds the timing requirement; and
when the selected path does not exceed the timing requirement in the path-based mode, lowering a cell delay in the worst-based mode of each cell in the selected path, wherein the operation of lowering the delay in the worst-based mode of each cell in the selected path further comprises:
lowering a maximal cell delay in the worst-based mode of each cell in the selected path.

11. The non-transitory computer readable medium as defined in claim 10, wherein a cell delay of each cell in each path is obtained in a timing signoff to determine the propagation delay of each path in the integrated circuit in the path-based mode, wherein a maximal cell delay and a minimal cell delay of each cell in each path are obtained from the timing signoff to determine the propagation delay of each path in the integrated circuit in the worst-based mode.

12. The non-transitory computer readable medium as defined in claim 10, wherein the operations further comprise:
when the propagation delay of the selected path does not exceed the timing requirement in the path-based mode, determining whether the propagation delay of another selected path from a pool exceeds the timing requirement in the path-based mode.

13. The non-transitory computer readable medium as defined in claim 10, wherein the operations further comprise:
when the propagation delay of the selected path exceeds the timing requirement in the path-based mode, determining whether the propagation delay of the selected path exceeds the timing requirement by a threshold;
when the propagation delay of the selected path does not exceed the timing requirement by the threshold, lowering the cell delay of each cell in the selected path, wherein information about an updated cell delay of the at least one cell in the selected path is stored in a register; and
when the propagation delay of the selected path exceeds the timing requirement by the threshold, popping up a warning message and determining whether the propagation delay of another selected path from a pool exceeds the timing requirement in the path-based mode.

14. The non-transitory computer readable medium as defined in claim 13, wherein the operations further comprise:
after the step of lowering the cell delay of each cell in the selected path, determining whether the propagation delay of another selected path from the pool exceeds the timing requirement in the path-based mode.

15. The non-transitory computer readable medium as defined in claim 13, wherein the operations further comprise:
before the step of determining whether the propagation delay of another selected path from the pool exceeds the timing requirement in the path-based mode, determining whether the pool is empty;
when the pool is empty, determining whether the register is empty;
when the pool is not empty, selecting another selected path from the pool;
when the pool and the register are empty, ending the method;
when the pool is empty and the register is not empty, updating the propagation delay of each path in the integrated circuit in the worst-based mode according to the updated cell delay in the register; and
after the step of updating the propagation delay of each path in the integrated circuit according to the updated cell delay in the register, executing the step of collecting the first predetermined number of paths violating the timing requirement into the pool once again.

16. The non-transitory computer readable medium as defined in claim 15, wherein the operation of determining whether the pool is empty, the operation of determining whether the register is empty, the operation of updating the propagation delay of each path in the integrated circuit in the worst-based mode according to the updated cell delay in the register, and the operation of collecting the first predetermined number of paths whose propagation delay exceeds the timing requirement into the pool are performed a second predetermined number of times.

17. The non-transitory computer readable medium as defined in claim 16, wherein when the second predetermined number is lower than the first predetermined number, the first predetermined number remains the same in the next iteration.

18. The non-transitory computer readable medium as defined in claim 16, wherein when the second predetermined number is increased by 1, the first predetermined number is increased by 1 accordingly.

* * * * *